United States Patent [19]

Nakayama

[11] Patent Number: 4,897,329
[45] Date of Patent: Jan. 30, 1990

[54] METHOD FOR PREPARING A LITHOGRAPHIC PRINTING PLATE AND A LIGHT-SENSITIVE MATERIAL USED THEREFOR

[75] Inventor: Takao Nakayama, Shizuoka, Japan
[73] Assignee: Fuji Photo Film Co., Ltd., Kanagawa, Japan
[21] Appl. No.: 3,885
[22] Filed: Jan. 16, 1987

Related U.S. Application Data

[63] Continuation-in-part of Ser. No. 478,569, Mar. 24, 1983, abandoned.

[30] Foreign Application Priority Data

Mar. 24, 1982 [JP] Japan ................................. 57-45557

[51] Int. Cl.⁴ ............................................ G03G 13/28
[52] U.S. Cl. ........................................ 430/49; 430/60; 430/156; 430/302; 430/528; 430/530
[58] Field of Search ............... 430/270, 528, 530, 156, 430/302, 49, 54, 60

[56] References Cited

U.S. PATENT DOCUMENTS

| | | | |
|---|---|---|---|
| 3,313,626 | 4/1967 | Whitney | 430/156 |
| 3,862,254 | 2/1975 | Wemmers | 430/191 |
| 3,944,417 | 3/1976 | Lind | 430/49 |
| 4,288,520 | 9/1981 | Sprintschnik | 430/302 |
| 4,336,319 | 6/1982 | Nagashima et al. | 430/191 |
| 4,435,491 | 3/1984 | Kitamura et al. | 430/49 |

FOREIGN PATENT DOCUMENTS 53362 6/1982 European Pat. Off. .

OTHER PUBLICATIONS

Kitamura et al., "High Speed Platemaking" by coupling of a conventional presensitized plate and an electrographic layer, Photo Sci. and Evl., vol. 26, No. 3, May/Jun. 1982, pp. 158–161.
Kitamura et al., "High Speed Platemaking" by coupling of a conventional presensitized plate and an electrographic layer (II), Electrophotography, vol. 2, No. 2, 1983, pp. 62–68.

*Primary Examiner*—Paul R. Michl
*Assistant Examiner*—Mark R. Buscher
*Attorney, Agent, or Firm*—Sughrue, Mion, Zinn, Macpeak & Seas

[57] ABSTRACT

A method for preparing a lithographic printing plate and a light-sensitive material for a lithographic printing plate are disclosed. The method comprises providing a light-sensitive material comprising an electroconductive support having a hydrophilic surface. Provided on the surface is a light-sensitive layer which contains an electroconductive agent as well as a photoconductive insulating layer. The material is imagewise exposed and then electrophotographically processed to form an electrostatic latent image on the photoconductive insulating layer. The exposed material is developed with developer particles which are opaque to the light which the light-sensitive layer is sensitive. The light-sensitive layer of the developed material is exposed through the image. The exposed or unexposed areas of the light-sensitive layer are then removed together with the photoconductive insulating layer. The lithographic printing plate produced has excellent resolving power and does not cause printing stains.

14 Claims, 1 Drawing Sheet

METHOD FOR PREPARING A LITHOGRAPHIC PRINTING PLATE AND A LIGHT-SENSITIVE MATERIAL USED THEREFOR

This is a continuation-in-part of application Ser. No. 06/478,569, filed March 23, 1983 now abandoned.

FIELD OF THE INVENTION

This invention relates to a method for preparing a lithographic printing plate and a light-sensitive material used therefor.

BACKGROUND OF THE INVENTION

A light-sensitive material having a photo-conductive layer which is used for making a printing plate by an electrophotographic method is known. For example, a light-sensitive material used for a printing plate comprising a support having provided thereon a metal layer, a photoresist layer and a photoconductive layer has been proposed.

Complicated steps which comprise uniformly charging a photoconductive layer, imagewise exposing it to a light to which a photoresist layer is not light-sensitive to prepare an electrostatic latent image on the photoconductive layer, developing the latent image with a toner, fixing or non-fixing a toner image, exposing the photoresist layer under a different condition from that as mentioned above to harden the exposed portion of the photoresist layer, removing the toner image and the photoconductive layer, removing the unhardened portion of the photoresist layer with a solvent, etching a metal layer and removing the photo-resist layer remaining on a metal layer are required to prepare a printing plate using the above mentioned light-sensitive material. A high degree of skill is required to prepare a good printing plate. However, the resolving power of the plate is not satisfactory since the developing method of an electrostatic latent image formed on the photoconductive layer is formed by a dry method. Furthermore, clearness of a printing image thus obtained is not satisfactory because of the removal of a photo-resist layer and an etching operation of a metal layer.

To eliminate the above defects, European Patent Application, Published No. 0053362 discloses a light-sensitive material which comprises an electroconductive support having a hydrophilic surface, a positive working light-sensitive layer and a photoconductive insulating layer wherein the positive working light-sensitive layer and the photoconductive insulating layer form one layer or the former and the latter are provided on the support respectively. The photoconductive insulating layer is substantially capable of being charged negatively or positively and does not prevent the selective removal of the positive working light-sensitive layer. The applicant of the present invention also proposed a method for lithographic printing using the above light-sensitive material which comprises (1) a step of forming a latent image electrophotographically on a photoconductive layer of the light-sensitive material, (2) a step of developing the latent image with a liquid developer containing developer particles which are opaque to the light to which the positive working light-sensitive layer is light-sensitive, (3) a step of exposing the positive working light-sensitive layer through the developed image thus obtained in the step (2), and (4) a step of selectively removing the areas of the positive working light-sensitive layer which do not have the developed image. The above method and the light-sensitive material are disclosed and claimed in European Patent Application Published No. 0053362.

The above method offers an improvement on the conventional method with respect to simplification of the steps and resolving power. However, a printing stain is caused when printing is carried out using the printing plate obtained by the above method.

The inventor of this invention has investigated the cause of the stain and has found that it was caused because, where a photoconductive insulating layer is charged and is imagewise exposed to form an electrostatic latent image, the electric charge on the exposed areas is not completely removed, a toner is attached to the exposed areas at the development, and where the positive working light-sensitive layer is exposed, unexposed areas remain because of the toner attached to the non-imaged areas as a fog in the step (3), and when the light-sensitive layer is selectively removed in the step (4), the unexposed areas remain on a support.

The inventor has found that the printing stains are caused by the presence of the aluminum oxide formed on an aluminum or an aluminum alloy support and can be prevented where the aluminum oxide layer is kept in the amount of 0.2 to 2.8 $g/m^2$, and has filed as a co-application Japanese Patent Application No. 32214/82.

SUMMARY OF THE INVENTION

The inventor has further investigated and has found that when a light-sensitive layer and a photo-conductive insulating layer are provided respectively, the printing stain is caused by the presence of the light-sensitive layer residing under the insulating layer. That is, when a positive working light-sensitive layer and a photoconductive insulating layer are provided separately in the above-mentioned light-sensitive material, when a photoconductive insulating layer is charged and imagewise exposed, the electric charge on the photoconductive layer on the exposed areas is prevented from passing through the photoconductive layer to the side of the support, because the light-sensitive layer residing under the insulating layer is insulated. Therefore, electric charges partially remain and a toner is attached thereto at the development to form fogs, as is the same with the oxidized layer as mentioned above. That is the cause of the printing stain. The inventor of this invention was successful in preventing the printing stain by incorporating a conductive agent into a light-sensitive layer without affecting the light-sensitive characteristic of the light-sensitive layer and has achieved this invention.

Additionally, the inventor of this invention has investigated the case with regard to the negative working light-sensitive layer as well as the positive working light-sensitive layer and has found that the printing stain can be prevented by incorporating the conductive agent into the negative working light-sensitive layer.

Where an aluminum or an aluminum alloy is used as a support, the printing stains are prevented to a greater extent by incorporating the electroconductive agent in a light-sensitive layer provided on a support and by maintaining the amount of the oxide layer on a support at 0.2 to 2.8 $g/m^2$ as previously found by the inventor.

Accordingly, an object of this invention is to provide a method for preparing a lithographic printing plate having an excellent resolving power and which does not cause printing stains.

Another object of this invention is to provide a light-sensitive material used for preparing the above-mentioned lithographic printing plate.

DETAILED DESCRIPTION OF THE INVENTION

The present invention is a method for preparing a lithographic printing plate, and a light-sensitive material used in the method. The method comprises electrophotographically processing a light-sensitive material comprising an electroconductive support having a hydrophilic surface and having provided thereon a light-sensitive layer and a photoconductive insulating layer in this order, to form an electrostatic latent image on the photoconductive insulating layer. The electrostatic latent image is then developed with developer particles which are opaque to the light to which the light-sensitive layer is sensitive. The light-sensitive layer is exposed through the developed image, and the exposed or unexposed areas of the light-sensitive layer in combination with the photoconductive insulating layer provided thereon are removed. The invention is characterized by the incorporation of a conductive agent in the light-sensitive layer.

Figure 1:
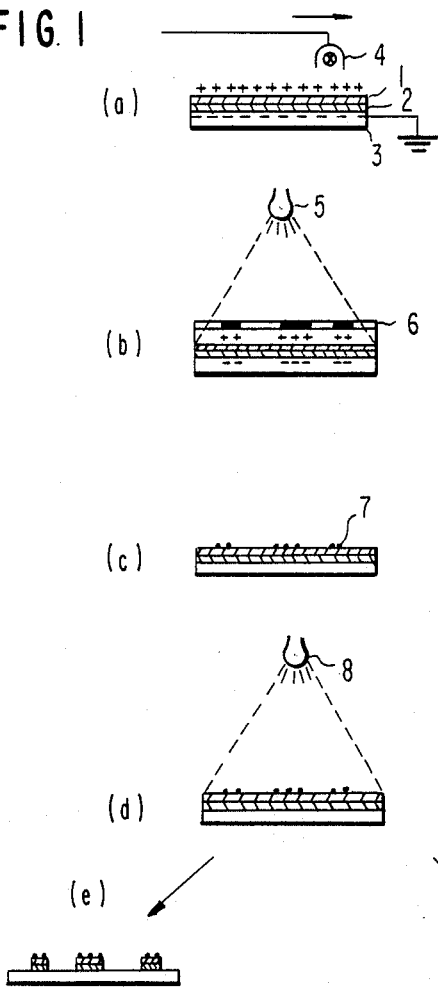
FIG. 1 is a schematic view of the method of the present invention showing steps a, b, c, d, e and e'.
Figure 2:
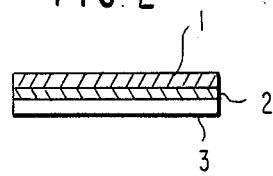
FIGS. 2, 3 and 4 are cross sectional views of the light-sensitive materials for a lithographic printing plate of the present invention.
Figure 3:
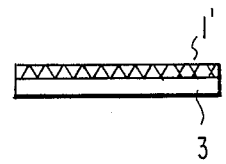

This invention is further explained hereinafter using the positive working light-sensitive layer by the accompanying drawings. FIG. 1 is a schematic view showing the steps in the method for preparing the lithographic printing plate of this invention. In step (a) of FIG. 1, the surface of the photoconductive insulating layer (1) provided on the positive working light-sensitive layer (2) which contains a conductive agent as described hereinafter and is formed on a conductive support, is charged with a charging device (4), while the conductive support is grounded. The charging device is a corotron type device which is commonly used in electrophotography.

The photoconductive insulating layer (1) is imagewise exposed (b) by a lamp (5) to remove the charge on the non-imaged areas. When a positive original is used as an original (6), a positive latent image can be obtained. When a negative original is used, a negative latent image can be obtained. In the former case, reversal development must be carried out to obtain a positive image.

The light-sensitive plate forming an electrostatic latent image is subjected to a liquid development in step (c) to form a toner image (7). The development time can be changed in accordance with the charging electric potential of the light-sensitive material, $\zeta$ potential of the toner, development electrode and the method of development, and is normally several seconds to 1 minute to obtain a sufficient density to use as a photo pattern mask.

When a reversal development is carried out, if a photoconductive insulating layer is charged negatively, a negatively charged toner is used, and if it is charged positively, a positively charged toner is used. Voltage having the same polarity is applied to the development electrodes. The upper limit of the voltage is the voltage at which the photoconductive insulating layer is charged. The distance between the electrodes should be as short as possible to obtain a good result. Generally, the voltage is 10 to 300 V, the distance between electrodes is 0.5 to 10 mm, and the development time is several seconds to 1 minute.

The developing solution is removed from the light-sensitive plate by a squeeze after development, and the light-sensitive plate is exposed over its entire surface in step (d) to an ultraviolet lamp (8) to render the non-imaged areas of the positive working light-sensitive layer soluble.

The light-sensitive plate is dissolved with an alkali solution in steps (e) or (e') to remove the non-imaged areas of the light-sensitive layer and thus a lithographic printing plate having a positive image on a support is obtained. In this dissolution step, the remaining areas as a positive image on a support are comprised of an insoluble positive working light-sensitive layer, a photoconductive insulating layer and a toner layer [(e) in FIG. 1]. A positive image can clearly be read with a toner. The positive image plate formed is particularly advantageous when the colored images are developed with a toner, the color of which corresponds to that of each colored images by color separation such as cyan, magenta, yellow and black, because a multicolored lithographic printing plate can be obtained.

Figure 4:
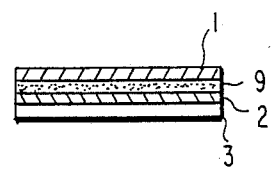

Another embodiment of this invention is shown in FIG. 4 which is a light-sensitive material having a photoconductive insulating layer (1) and a positive working light-sensitive layer (2), and an intermediate layer (9) therebetween. The intermediate layer must be electrically conductive so as to accelerate electric charges having the opposite polarity to that of the electric charges on the surface of the photoconductive insulating layer being rapidly maintained on the side of the positive working light-sensitive layer on the aluminum support. This intermediate layer can prevent a photoconductive insulating layer from penetrating into or mixing with the positive working light-sensitive layer. The intermediate layer is a water-soluble resin which is properly electroconductive and insoluble to the positive working light-sensitive layer. The intermediate layer is dissolved and removed in a dissolution step (e') together with a photoconductive insulating layer having a toner image. Thus, a lithographic printing plate having a printing surface of the positive working light-sensitive layer on a support can be obtained.

Generally, the thickness of the photoconductive insulating layer effects the charging property, light penetration, time of development and resolving power degree and is generally 0.5 to 5μ and preferably 1 to 2μ.

A thickness of the intermediate layer is determined by the permeability of the solvent used in the dissolution step and the resolving power and is generally 0.1 to 5μ and preferably 0.2 to 0.5μ.

The photoconductive material used as a photo-conductive insulating layer in this invention includes those that are generally used as a light-sensitive material for electrophotography. It is preferred that the photoconductive material is used as a dispersion dispersed in or a solution dissolved in an insulating binding resin. The photoconductive material used in this invention must not absorb the light which the positive working light-sensitive layer residing under the photoconductive insulating layer absorbs. It is preferred that the photoconductive insulating layer should be as thin as possible so that the light penetration amount is large in the light-sensitive material for the lithographic printing in this invention. The photo-conductive insulating layer can be positively or negatively charged.

The photoconductive material suitable for corona positive charging includes an inorganic material such as Se, Se-Te and PbO; a low molecular substance such as anthracene, perylene, tetracene, carbazole, tetrabenzyl-p-phenylenediamine, an acylhydrazone derivative, an oxadiazole derivative, a pyrazoline derivative, an imidazolone derivative, an imidazothion derivative, a benzimidazole derivative, benzoxazole derivative, and a benzothiazole derivative; an organic pigment such as indigo, metal free phthalocyanine, metal phthalocyanine, squarium, dimethyl peryllimido; and an organic high molecular substance such as poly-N-vinylcarbazole, polyacenaphthylene, polyvinyl anthracene, polyvinyl pyrene, polyvinyltetracene and polyvinyl perillene.

The photoconductive material suitable for corona negative charging includes an inorganic material such as ZnO, CdS and $TiO_2$; a low molecular weight substance such as trinitrofluorenone, tetranitrofluorenone, dinitroanthracene and tetracyanopyrene; an organic pigment such as chlorodiane blue; and a complex of poly-N-vinylcarbazole and 2,4,7-trinitrofluorenone. The photoconductive material suitable for negative and positive corona charging can be a combination of the above-mentioned organic substances and the binding resin. Highly sensitive materials which are particularly suitable for practical use are metal free phthalocyanine, metal phthalocyanine, an oxadiazole derivative and a pyrazoline derivative. A light-sensitive material containing a charge generator and a charge transfer and a copolymer of an alkali-soluble resin and a photoconductive substance such as carbazole can also be used.

It is preferred that the photoconductive insulating layer contains an alkali-soluble resin, because the photoconductive insulating layer does not prevent the selective removal of the positive working light-sensitive layer in step of (e) and (e'). More specifically, the non-imaged areas of the photoconductive insulating layer is dissolved and removed together with the non-imaged areas of the positive working light-sensitive layer.

The alkali-soluble resin is preferably an insulating resin capable of forming a film which is useful as a binding agent for the high molecular organic photoconductive substance or as a solvent for the low molecular weight organic photoconductive substance. The resin includes a synthetic resin such as phenolformaldehyde resin, methacresol formaldehyde resin, styrene-maleic anhydride copolymer, polyacrylic acid-polyacrylic acid amide copolymer, fumaric acid-ethylene glycol copolymer, methyl vinyl ether-maleic anhydride copolymer, acryloyl glycine-vinyl acetate copolymer, polyvinyl pyrrolidone, polyvinyl alcohol, polyamide, alkali-soluble azide resin and halogenated polystyrene and a natural resin such as shellac, protein and glue.

A binding agent for particles of the photo-conductive material used for the photoconductive insulating layer is an insulating resin for improving the charging property of the insulating layer such as polyethylene terephthalate, polyimide, polycarbonate, polyacrylate, polymethyl methacrylate, polyvinyl fluoride, polyvinyl chloride, polyvinyl acetate, polystyrene, styrene-butadiene copolymer, polymethacrylate, silicone resin, chlorinated rubber, epoxy resin, pure and modified alkyd resin, polyethyl methacrylate, poly-n-butylmethacrylate, a cellulose acetate, ketone resin, polyethylene, polypropylene, polyacrylonitrile, a rosin derivative, polyvinylidene chloride and nitrocellulose.

The intermediate layer, if necessary, provided between the photoconductive insulating layer and the positive working light-sensitive layer can contain a water-soluble resin having a suitable conductivity such as polyvinyl alcohol, alkylhydroxy alkyl cellulose, polyacrylic acid, polyacrylic acid derivative, polyacrylamide, polyvinyl pyrrolidone, polyvinyl methyl ether or reaction products of maleic anhydride with vinyl compound or acrylic compound.

A positive working light-sensitive layer can be prepared by dissolving a light-soluble substance, e.g., an o-quinonediazide compound or a depolymerizable light-sensitive resin alone or in combination with an alkali-soluble resin in a proper solvent and coating it on an electroconductive support. Useful alkali-soluble resins include those mentioned above used for the photoconductive insulating layer. Such resins are included in an amount of about 50 to 85 wt % of the light-sensitive layer. Conventionally known plasticizers such as dioctyl phthalate can be incorporated in an amount of not more than 5 wt % in the light-sensitive layer to give flexibility. This positive working light-sensitive layer is coated in an amount of about 0.5 to 7 $g/m^2$ on an electroconductive support.

The mixing ratio of the photoconductive material, the insulating resin and an alkali-soluble resin in the photoconductive insulating layer is determined by the photoconductivity, the charging property, the light penetration, the dissolving and permeating speed of the developing solution. Good characteristics are obtained when the mixing ratio is 5 to 30 wt % of the photoconductive material, 0 to 30 wt % of the insulating resin and 50 to 85 wt % of the alkali-soluble resin. When an alkali-soluble resin having low resistance is used, the charging property is improved with insulating resin, and when an alkali-soluble resin having high resistance is used, the insulating resin may not be contained. When a photoconductive insulating layer and a positive working light-sensitive layer form one layer, the mixing ratio is 5 to 30 wt % of the photoconductive material, 0 to 30 wt % of the insulating resin and 50 to 85 wt % of a light-soluble substance.

This invention is characterized by incorporating an electroconductive agent as hereinafter mentioned in a light-sensitive layer to prevent the printing stains.

The electroconductive agent used in this invention can provide a suitable electroconductivity in the light-sensitive layer without having undesirable affects on light-sensitive characteristics, development characteristics and printing characteristics of the light-sensitive layer. Further, the agent does not prevent the charge on the exposed areas from transferring to the support when the photoconductive insulating layer is imagewise exposed.

Examples of useful conductive agents include colloidal alumina; colloidal silica; metallic powder such as Al, Zn, Ag, Fe, Cu, Mn or Co; metallic salts thereof such as chloride, bromide, sulfate, nitrate or oxalate; metal oxides such as ZnO, $SnO_2$, or $In_2O_3$; surface active agents such as alkanol amine salt of alkyl phosphate, polyoxyethylene alkyl phosphate, alkylmethyl ammonium salt, N,N-bis(2-hydroxyethyl)alkylamine, alkyl sulfonate, alkyl-benzenesulfonate, fatty acid choline ester, polyoxyethylene alkylether, the phosphate thereof and the salt thereof, fatty acid monoglyceride, partially esterified fatty acid sorbitan, a cationic high molecular weight electrolyte; and an anionic high molecular weight electrolyte.

Examples of useful cationic high molecular weight electrolytes include primary, secondary and tertiary ammonium salt such as polyethylene imine hydrochloride or poly(N-methyl-4-vinylpyridinium chloride); a quaternary ammonium salt such as poly(2-methacryloxyethyltrimethyl ammonium chloride), poly(2-hydroxy-3-methacryloxypropyltrimethyl ammonium chloride), poly(N-acrylamidopropyl-3-trimethyl ammonium chloride), poly(N-methylvinylpyridinium chloride), poly(N-vinyl-2,3-dimethylimidazolium chloride), poly(diallyl ammonium chloride) or poly(N,N-dimethyl-3,5-methylenepiperidinium chloride); a sulfonium salt such as poly(2-acryloxyethyldimethylsulfonium chloride); and a phosphonium salt such as poly(glycidyltributylphosphonium chloride). As the anionic high molecular weight electrolytes, there are a carboxylate such as poly(meth)acrylic acid, hydrolyzed polyacrylate, hydrolyzed polyacrylic amide or hydrolyzed polyacrylic nitrile; polystyrene sulfonate, polyvinyl sulfonate; and phosphonate such as polyvinyl phosphonate.

The above-mentioned conductive agents can be used alone or in combination, and can be added to a coating composition prior to coating the light-sensitive layer. The amount of the electroconductive agent is determined so that the resistance of the light-sensitive layer in bulk direction is not higher than $10^{10}\Omega/cm^2$, and so that the characteristics of the light-sensitive layer are not degraded.

The electroconductive support which is lower-most on the light-sensitive material for lithographic printing used in this invention is, for example, a surface treated aluminum plate, on which a positive working light-sensitive layer is provided. A preferred aluminum plate includes a pure aluminum plate, an aluminum alloy plate and a plastic film laminated or vacuum-evaporated with an aluminum. It is preferred that a surface of the aluminum plate is subjected to graining treatment or anodic oxidation, or is treated with an aqueous solution of sodium silicate, potassium fluoric zirconium or phosphate. The surface treatment is carried out not only to make the surface of the support hydrophilic but also to prevent the undesirable reaction of the support with the positive working light-sensitive layer provided thereon as well as to increase the close contact of the light-sensitive layer with the support.

In this invention, the printing stains are prevented to a greater extent by using 0.2 to 2.8 g/m² of the oxide layer of the aluminum plate. The presence of the oxide layer is closely related to the printing durability of the printing plate. Generally, the greater the amount of the oxide layer, the larger the printing durability is. For example, if more than 100,000 copies are needed, those copies having sufficient characteristics are obtained by incorporating the electroconductive agent into the light-sensitive layer, even if the amount of the oxide layer is not decreased.

The liquid developer used in step (c) of the liquid development of this invention is a well-known carbon black dispersed in gasoline, kerosene and carbon tetrachloride which contains alkyd resin and a linseed oil to retain the electric characteristic uniformly, as disclosed in Japanese Patent Publication No. 13424/60. Both negatively and positively charged toners can be used. The negatively charged toner includes carbon black, lead chromate and charcoal dispersed in an aliphatic hydrocarbon, gasoline, cyclohexane, pentane and CCl₄ and containing a linseed oil, polyethylene and shellac as a controlling agent. The positively charged toner includes carbon black, phthalocyanine blue, charcoal and vermilion red dispersed in an aliphatic hydrocarbon, kerosene, cyclohexane, pentane and CCl₄ containing alkyd resin, versamide and tergitol as a controlling agent. The size of the developer particle is not larger than 1µ, which is suitable for obtaining an image with a high degree of resolution.

The alkali solution used for dissolving and removing the exposed areas of the positive working light-sensitive layer in steps (e) and (e') of this invention includes an aqueous solution of an inorganic alkali substance such as sodium silicate, potassium silicate, sodium hydroxide, potassium hydroxide, lithium hydroxide, sodium phosphate, sodium secondary phosphate, ammonium phosphate, ammonium secondary phosphate, sodium metasilicate, sodium bicarbonate, and aqueous ammonia. The concentration thereof is about 0.1 to about 10 wt %, and preferably about 0.5 to about 5 wt %. The pH of the alkali solution is 12.5 to 13.9, which is suitable for developing the positive working light-sensitive material. A surface active agent and an organic solvent can be incorporated in the alkali solution, if necessary.

In the above-mentioned explanations, a liquid development is conducted to develop the latent image of the photoconductive insulating layer, and a dry development such as a cascade development or a magnetic brush development can also be used.

This invention has been explained using the positive working light-sensitive layer, but the invention is also applied to the negative working light-sensitive layer.

In the embodiment of this invention as shown in FIG. 1, a photoconductive layer 1 and a negative working light-sensitive layer 2 composed mainly of a diazo compound or a diazo resin are provided on an aluminum support 3. The same steps as in the case of the positive working light-sensitive layer are repeated regarding the charging, image-exposure, a toner development and a complete surface exposure with an ultraviolet ray. In case of the negative working light-sensitive layer, when the ultraviolet radiation is carried out, the non-imaged areas of the light-sensitive layer where a toner is not present are hardened or insoluble, and the non-exposed areas where a toner is present are removed and the exposed areas of the light-sensitive layer remain on a support. Thus, a lithographic printing plate having a hydrophobic positive image of the light-sensitive layer can be obtained.

The other materials and the processing conditions are entirely the same with the case with regard to the positive working light-sensitive layer. When using the negative working light-sensitive layer, a reversal development is not necessary to change from a negative image to a positive image.

The composition of the negative working light-sensitive layer is a diazo compound or a diazo resin alone as disclosed in U.S. Pat. No. 2,714,066 and a mixture of a diazo compound or a diazo with a binder, as disclosed in U.S. Pat. No. 2,826,501 and British Pat. No. 1,074,392.

The diazo compound includes diazonium salt and a diazo resin as a condensation product of p-diazophenylamine and formaldehyde.

Preferred diazo compounds are a compound having not less than 2 diazo groups in one molecule such as a condensation product of a formaldehyde with a salt of p-diazodiphenylamine such as a phenol salt, fluorocaprilate, and a salt of sulfonic acid such as triisopropylnaphthalenesulfonic acid, 4,4'-biphenyl-disulfonic acid, 5-nitroorthotoluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprilnaphthalenesulfonic acid, 1-naphthol-5-sulfonic acid, 2-methoxy-4-hydroxy-5-benzoylbenzenesulfonic acid and para-toluenesulfonic acid. Particularly preferred diazo compounds are a condensation product of 2,5-dimethoxy-o-4-p-tolymercaptobenzenediazonium and formaldehyde including the above salts, a condensation product of 2,5-dimethoxy-4-morpholinobenzenediazonium and formaldehyde or acetoaldehyde and the compound as disclosed in Japanese patent application (OPI) No. 33907/73 (the term "OPI" as used herein refers to a "published unexamined Japanese patent application").

Those compounds as disclosed in U.S. Pat. No. 2,649,373 are also preferred.

The most preferred diazo compound is a 2-methoxy-4-hydroxy-5-benzoylbenzenesulfonate as a condensation product of p-diazophenylamine and formaldehyde.

The binder used together with a diazo compound includes a 2-hydroxyethyl methacrylate copolymer as disclosed in British Pat. No. 1,460,978 and U.S. Pat. No. 4,123,276, a copolymer of a monomer having an aromatic hydroxyl group as disclosed in Japanese patent application (OPI) No. 98614/79, a β-hydroxyethyl (meth)acrylate polymer and a copolymer having more than 50% of β-hydroxyethyl (meth)acrylate, a polymer of the above (meth)acrylate, and a copolymer a part of which is substituted with a low molecular weight polyurethane resin having a hydrophilic ether group as disclosed in Japanese Patent Publication No. 9697/81.

Further, a photopolymerizable composition used as a negative working light-sensitive layer is hereinafter explained. The photopolymerizable composition includes a binder, an addition polymerizable unsaturated monomer and a photopolymerization initiator. The binder of the photopolymerizable composition includes a copolymer of methyl (meth)acrylate/(meth)acrylic acid, a half ester and half amide of a copolymer of styrene/maleic anhydride, a copolymer of benzyl (meth)acrylate/(meth)acrylic acid, a copolymer of benzyl (meth)acrylate/itaconic acid, a copolymer of styrene/itaconic acid, a copolymer of vinyl acetate/crotonic acid, acid cellulose phthalate, and a copolymer of (meth)acrylic acid/styrene/alkyl (meth)acrylate.

The unsaturated monomer may be a compound having at least one addition polymerizable unsaturated group. Preferable examples include ethylene glycol di(meth)acrylate, polyethylene glycol di(meth)acrylate, trimethylolethane tri(meth)acrylate, trimethylolpropane tri(meth)acrylate, neopentylglycol di(meth)acrylate, pentaerythritol, tri-, tetra- and hexa(meth)acrylate of pentaerythritol, epoxydi(meth)acrylate, oligoacrylate as disclosed in Japanese Patent Publication No. 7361/77, an oligomer of acrylurethane resin and acrylurethane as disclosed in Japanese Patent Publication No. 41708/73.

As the photopolymerization initiators, there are vicinal polyketaldonyl compound as disclosed in U.S. Pat. No. 2,367,660, α-carbonyl compound as disclosed in U.S. Pat. Nos. 2,367,661 and 2,367,670, acyloinether as disclosed in U.S. Pat. No. 2,448,828, an aromatic acyloin compound substituted with α-hydrocarbon as disclosed in U.S. Pat. No. 2,722,512, polynuclear quinone compound as disclosed in U.S. Pat. Nos. 3,046,127 and 2,951,758, a combination of triallylimidazole dimer/p-aminophenylketone as disclosed in U.S. Pat. No. 3,549,367, benzothiazole compound as disclosed in Japanese Patent Publication No. 48516/76, benzothiazole compound and trihalomethyl-s-triazine compound as disclosed in Japanese patent application (OPI) No. 74887, acridine and phenazine as disclosed in U.S. Pat. No. 3,751,259.

Additionally, it is preferred to add a thermo-polymerization preventing agent such as hydroquinone, p-methoxyphenol, di-tert-butyl-p-cresol, pyrogallol, tert-butylcatechol, benzoquinone, 4,4'-thiobis(3-methyl-6-t-butylphenol), 2,2'-methylenebis(4-methyl-6-t-butylphenol) or 2-mercaptobenzimidazole. And, if necessary, a dye or a pigment can be added to color a light-sensitive layer or a pH indicator as a printing out agent can be added.

After the light-sensitive layer is exposed with ultraviolet rays, the unexposed areas where a toner is present on a photoconductive layer are selectively dissolved and removed by a developing solution. The composition of the developing solution can be varied depending upon the type of diazo compounds and the carrier, and generally can include a wetting agent such as sodium salt of lauryl alcohol sulphate (trade name of "Monogen Y-100", manufactured by Daiichi Kogyo Seiyaku Co., Ltd.), sodium salt of alkyllauryl sulfate, sodium salt of octyl sulfate, ammonium salt of lauryl sulfate, sodium xylene sulfonate or monosodium salt of N,N-dihydroxyethylene glycine and an aqueous alkali solution containing an inorganic alkali agent or an organic amine compound. A water-miscible organic solvent, e.g., alcohols such as ethylene glycol monobutyl ether or benzyl alcohol; carboxylic acid esters such as ethyl acetate or butyl acetate; ketones such as methyl isobutyl ketone; and alkyl substituted aromatic hydrocarbons such as xylene can be preferably added in a small amount.

In accordance with the invention, fog formed in the development of the photoconductive insulating layer and printing stain caused by the fog can be prevented by incorporating the electroconductive agents as mentioned above not only into the positive working light-sensitive layer but also into the negative working light-sensitive layer.

This invention will be further explained with the following examples. However, this invention is not limited to these examples. In the examples, "part" means "part by weight".

EXAMPLE 1

An aluminum plate having a thickness of 0.24 mm was subjected to graining treatment and anodically oxidized in a sulfuric acid bath to prepare about 2.7 g/m$^2$ of an oxidized layer. The layer was sufficiently washed, dried and coated with a light-sensitive solution prepared by the following compositions by a whirler and was dried to obtain a light-sensitive layer in a dry thickness of 2.3 g/m$^2$.

| Compositions of the Light-Sensitive Solution | |
|---|---|
| | parts |
| Ester compound of naphthoquinone-(1,2)-diazide-(2)-5-sulfonic acid and pyrogallol acetone resin | 0.85 |
| Cresol novolak resin | 0.05 |

-continued

| Compositions of the Light-Sensitive Solution | |
|---|---|
| | parts |
| Methyltetrahydrophthalic anhydride | 0.20 |
| p-t-Butylphenol resin | 2.10 |
| Methyl cellosolve acetate | 20 |
| Methyl ethyl ketone | 10 |
| Methanolsilica (35% methanol solution; prepared by Nissan Kagaku Co., Ltd.) | 0 to 4 |

Further, the following light-sensitive solution was dispersed by an ultrasonic dispersing device for 5 minutes and was coated by a wire bar and dried at 70° C. for 1 minute to provide a photosemiconductive layer.

| Compositions of the Light-Sensitive Solution | |
|---|---|
| | parts |
| Novolak type phenol resin (33 wt % in isopropyl alcohol) | 12 |
| (ethylacrylate$_{62}$-methylmethacrylate$_{25}$-methyl acrylic acid$_{13}$) 25% in ethyl alcohol | 4 |
| Phthalocyanine pigment (Sumika Print GN-0) | 1 |
| Toluene | 25 |

Figure 5:
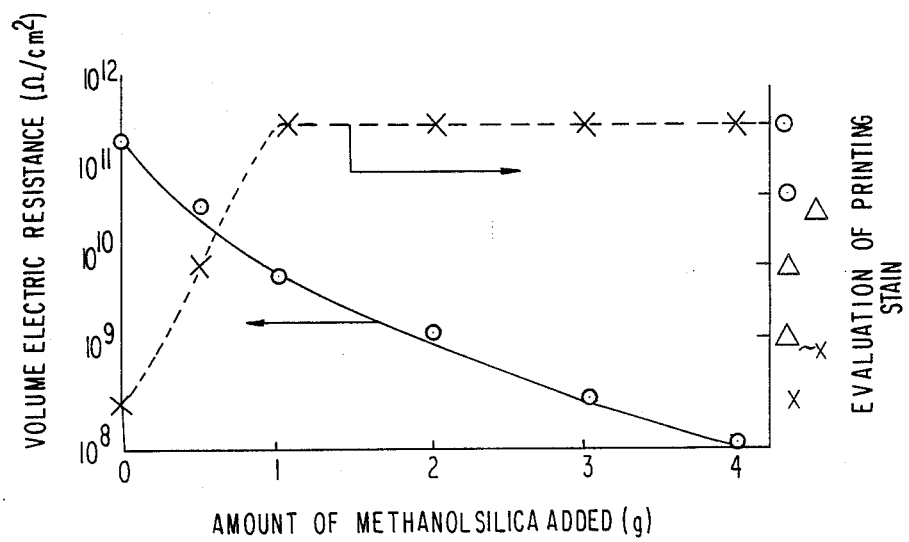
FIG. 5 is a graph showing the change of the additive amount of methanolsilica and the volume electric resistance of the light-sensitive layer.

The solid content in the photosemiconductive layer was 2.6 g/m$^2$. This light-sensitive plate was given a positive corona charge by a corona charging device set with +6,000 voltage, exposed for 3 seconds with a tungsten lamp having 60 lux through a positive transparency, immersed in a liquid developing solution (MRP-610, manufactured by Ricoh Co., Ltd.) having a negatively charged toner for 20 seconds and dried by an air flow to provide a positive toner image. The entire surface of the plate was then exposed for 75 seconds by an A-3 printer (Exposure Device for Pre-Sensitized plate) manufactured by Fuji Photo Film Co., Ltd. and developed for 1 minute in a developing DP-3 solution for presensitized plate manufactured by Fuji Photo Film Co., Ltd. which was diluted with water by 1/7 (i.e., 1 part by volume of DP-3 to 6 parts by volume of water) to obtain a lithographic printing plate. The additive amount of methanolsilica (an electroconductive agent) contained in the positive working light-sensitive solution, the volume electric resistance of the positive working light-sensitive layer and the printing stain of printed copies are shown in FIG. 5. To arrive at FIG. 5, printing plates prepared by plate-making samples having different electric resistance of the light-sensitive layer due to the difference of the amount of methanolsilica added were subjected to a printing operation with a printing machine ("GTO", manufactured by Heiderberg Co.) using an ink ("Super HG", manufactured by Dainippon Ink and Chemicals, Inc.) and a dampening water ("EU-3" (100 times diluted), manufactured by Fuji Photo Film Co.) under the standard printing conditions at a printing speed of 8,000 copies/hour.

The reflection density of the non-image portion of the 100th printed copy was measured with a Macbeth densitometer "RD 517".

The evaluation results on printing stain in FIG. 5 were obtained on the 100th printed copy from the reflection density ($\Delta D$) of the non-image portion obtained by subtracting the base density of a printing paper and the following relationship.

| Printing stain | Reflection density $\Delta D$ |
|---|---|
| o | $0.01 > \Delta D$ |
| o - $\Delta$ | $0.02 > \Delta D \geq 0.01$ |
| $\Delta$ | $0.03 > \Delta D \geq 0.02$ |
| $\Delta$- x | $0.07 > D \geq 0.03$ |
| x | $\Delta D \geq 0.07$ |

If the reflection density of the non-image portion of the printed copy is 0.03 or more, such is not practically used. That is, in the evaluations on the printing stain above indicated above, the marks $\Delta$—x and x show printed copies which are unsuitable in the stain of the non-image portion.

Printed copies of high quality without printing stains were obtained with the volume resistance of the light-sensitive layer being not higher than $10^{10}\Omega/\text{cm}^2$.

EXAMPLE 2

The same procedure as in Example 1 was repeated except that a positive working light-sensitive layer was prepared by using sodium salt of polyoxyethylene alkyl phosphate instead of methanolsilica as an electroconductive agent, to prepare a printing plate and obtain printed copies. Printing copies of high quality without printing stain were obtained with the volume resistance of the positive working light-sensitive layer being not higher than $10^{10}\Omega/\text{cm}^2$.

EXAMPLE 3

On the positive working light-sensitive layer prepared in Example 1, the photosemiconductive layer having the following compositions was coated by a wire bar to a solid content of 2.1 g/m$^2$.

| Compositions | |
|---|---|
| | parts |
| Ethyl acrylate/methyl methacrylate/ methyl acrylate copolymer (weight ratio: 62/25/13; in 25 wt % ethyl alcohol) | 12 |
| Microlith 4 G-T (Ciba Geigy) | 1.5 |
| Toluene | 25 |

The same procedure as in Example 1 was repeated except that —6,000 V of corona charge were applied instead of +6,000 and that a positive liquid developing solution (trade name "PM-313" for the plate maker manufactured by Iwasaki Tsushinki Co., Ltd.) was used instead of a liquid developing agent containing a negative toner (trade name "MRP-610", manufactured by Ricoh Co., Ltd.).

The printing operation was carried out using the thus-prepared printing plate to obtain printed copies of high quality without a printing stain with the volume electric resistance of the positive working light-sensitive layer being not higher than $10^{10}\Omega/\text{cm}^2$.

While the invention has been described in detail and with reference to specific embodiments thereof, it will be apparent to one skilled in the art that various changes and modifications can be made therein without departing from the spirit and scope thereof.

What is claimed is:

1. In a method for preparing a lithographic printing plate using a light-sensitive material comprising an electroconductive support having a hydrophilic surface provided thereon, in order, a light-sensitive layer and a separate photoconductive insulating layer, said method comprising the steps of:

electrophotographically forming an electrostatic latent image on the photoconductive insulating layer;

developing the latent image with toners which are opaque to the light to which the light-sensitive layer is sensitive, thereby forming a toner image;

exposing the light-sensitive layer through the toner image; and separating the exposed and unexposed areas of the light-sensitive layer, said light-sensitive layer comprising (a) a light-sensitive material selected from the group consisting of a composition comprising an o-quinonediazide, a composition comprising a diazo resin and a composition which is a photopolymerizable composition and (b) an electroconductive agent which is incorporated in the light-sensitive layer so that the electric resistance of the light-sensitive layer is not more than $10^{10}\Omega/cm^2$ in the bulk direction.

2. The method for preparing a lithographic printing plate as claimed in claim 1, wherein the separating of the exposed and unexposed areas is carried out by removing the exposed area of the light-sensitive layer together with the photoconductive insulating layer.

3. The method for preparing a lithographic printing plate as claimed in claim 1, wherein the separating of the exposed and unexposed areas is carried out by removing the unexposed areas of the light-sensitive layer together with the photoconductive insulating layer.

4. The method for preparing a lithographic printing plate as claimed in claim 1, wherein the light-sensitive layer and photoconductive insulating layer are separated by an intermediate layer.

5. The method for preparing a lithographic printing plate as claimed in claim 1, wherein the conductive support is comprised of a material selected from the group consisting of aluminum and aluminum alloy and the hydrophilic surface is comprised of 0.2 to 2.8 g/m² of an aluminum oxide layer.

6. A light-sensitive material for a lithographic printing plate, comprising:

an electroconductive support having a hydrophilic surface having provided thereon a light-sensitive layer containing an electroconductive agent and a separate photoconductive insulating layer, the photoconductive insulating layer being capable of electrophotographically forming an electrostatic latent image, exposed and unexposed areas of the light-sensitive layer being separable from each other and the photoconductive insulating layer, the light-sensitive layer comprising a light-sensitive material selected from the group consisting of a composition comprising an o-quinonediazide, a composition comprising a diazo resin, and a composition which is a photopolymerizable composition, the electroconductive agent being incorporated in the light-sensitive layer to such an extent that the electric resistance of the light-sensitive layer is not higher than $10^{10}\Omega$ in the bulk direction.

7. The light-sensitive material for a lithographic printing plate as claimed in claim 6, wherein the light-sensitive layer and photoconductive insulating layer are separated by an intermediate layer.

8. The light-sensitive material for a lithographic printing plate as claimed in claim 6, wherein the electroconductive support is comprised of a material selected from the group consisting of aluminum and aluminum alloy and the hydrophilic surface is comprised of 0.2 to 2.8 g/m² of an aluminum oxide.

9. The light-sensitive material for a lithographic printing plate as claimed in claim 6, wherein the photoconductive insulating layer contains a photoconductive material comprised of insulating resin and an alkali-soluble resin.

10. The light-sensitive material for a lithographic printing plate as claimed in claim 9, wherein the photoconductive insulating layer is comprised of 5 to 30 wt % of photoconductive material, 0 to 30 wt % of insulating resin and 50 to 85 wt % of alkali-soluble resin.

11. The method according to claim 1, wherein the electroconductive agent is colloidal alumina; colloidal silica; a metallic powder of Al, Zn, Ag, Fe, Cu, Mn or Co; a chloride bromide, sulfate, nitrate or oxalate metallic salt thereof; $SnO_2$ or $In_2O_3$; a surface active agent selected from an alkanol amine salt of alkyl phosphate, polyoxyethylene alkyl phosphate, alkylmethyl ammonium salt, N,N-bis(2-hydroxyethyl)alkylamine, alkyl sulfonate, alkylbenzenesulfonate, fatty acid choline ester, polyoxyethylene alkylether, the phosphate thereof and the salt thereof, fatty acid monoglycerine, partially esterified fatty acid sorbitan, a cationic high molecular weight electrolyte; and an anionic high molecular weight electrolyte.

12. The light-sensitive material of claim 6, wherein the electroconductive agent is colloidal alumina; colloidal silica; a metallic powder of Al, Zn, Ag, Fe, Cu, Mn or Co; a chloride, bromide, sulfate, nitrate or oxalate metallic salt thereof; $SnO_2$ or $In_2O_3$; a surface active agent selected from an alkanol amine salt of alkyl phosphate, polyoxyethylene alkyl phosphate, alkylmethyl ammonium salt, N,N-bis(2-hydroxyethyl)alkylamine, alkyl sulfonate, alkylbenzenesulfonate, fatty acid choline ester, polyoxyethylene alkylether, the phosphate thereof and the salt thereof, fatty acid monoglyceride, partially esterified fatty acid sorbitan, a cationic high molecular weight electrolyte; and an anionic high molecular weight electrolyte.

13. The method according to claim 1, wherein the photopolymerizable composition includes a binder, an addition polymerizable unsaturated monomer and a photopolymerization initiator.

14. The light-sensitive material of claim 6, wherein the photopolymerizable composition includes a binder, an addition polymerizable unsaturated monomer and a photopolymerization initiator.

* * * * *